United States Patent
Lordi et al.

(10) Patent No.: US 7,704,653 B2
(45) Date of Patent: Apr. 27, 2010

(54) METHOD OF DATA ENCODING, COMPRESSION, AND TRANSMISSION ENABLING MASKLESS LITHOGRAPHY

(75) Inventors: Vincenzo Lordi, Livermore, CA (US); Shem-Tov Levi, Cupertino, CA (US); Harald F. Hess, La Jolla, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 742 days.

(21) Appl. No.: 11/624,652

(22) Filed: Jan. 18, 2007

(65) Prior Publication Data
US 2008/0145767 A1    Jun. 19, 2008

Related U.S. Application Data

(60) Provisional application No. 60/854,496, filed on Oct. 25, 2006.

(51) Int. Cl.
*G03F 9/00* (2006.01)
*G03C 5/00* (2006.01)

(52) U.S. Cl. .......................... 430/22; 430/30; 430/296; 430/942

(58) Field of Classification Search .................. 430/22, 430/30, 296, 942
See application file for complete search history.

(56) References Cited

U.S. PATENT DOCUMENTS

| 6,787,784 | B1 | 9/2004 | Okunuki |
| 6,870,172 | B1 | 3/2005 | Mankos et al. |
| 2006/0115752 | A1 | 6/2006 | Latypov et al. |

FOREIGN PATENT DOCUMENTS

| EP | 1387389 | 2/2004 |
| WO | WO01/35165 | 5/2001 |

*Primary Examiner*—Christopher G Young
(74) *Attorney, Agent, or Firm*—Suiter Swantz pc llo

(57) ABSTRACT

A method and tool for conducting charged-particle beam direct write lithography is disclosed. A disclosed method involves condensing an initial design file down to a set of profiles and a pattern of relative locations to form a formatted pattern file. The formatted pattern file is adjusted to accommodate desired pattern corrections. Portions of the formatted pattern records are extracted to form data strips that have a plurality of channels with a pattern of profiles and spatial indicators. Data strips are sequentially read to construct a printable pattern of profiles and spatial indicators that specify the locations of the profiles. Additionally, the pattern of profiles are sequentially printed from each data strip onto a substrate to form the desired pattern on the substrate.

35 Claims, 7 Drawing Sheets

US 7,704,653 B2

METHOD OF DATA ENCODING, COMPRESSION, AND TRANSMISSION ENABLING MASKLESS LITHOGRAPHY

RELATED APPLICATIONS

This application claims priority to U.S. Provisional Application No. 60/854,496 filed Oct. 25, 2006, which application is hereby incorporated by reference.

GOVERNMENT LICENSE RIGHTS

The U.S. Government has a paid-up license in this invention and right in limited circumstances to require the patent owner to license others on reasonable terms as provided for by the terms of Contract No. DADA19-00-1001 awarded by the Defense Advanced Research Projects Agency.

TECHNICAL FIELD

Inventive concepts described herein relate generally to methods and apparatus for projecting a patterned electron beam onto a target substrate to achieve photolithographic patterning of a surface of the target. Particularly, the embodiments of invention refer to methods of data processing that enable an electron beam patterning system to accommodate the massive amounts of image that are required to lithographically pattern a surface with a patterned electron beam. The embodiments include data processing and encoding methods than enable the dynamic control of a pattern generation device having an array of addressable and selectively actuatable elements that enable the formation of a changing electron pattern.

BACKGROUND

Until recently it was not feasible to consider electron beam (e-beam) lithography as an efficient method of mass producing wafers. Older e-beam writers, while intensely precise, had extremely long process times making them notoriously slow. In fact such e-beam writers, due to the low rate of pattern transfer, were usually only used to form masks or small portions of wafers requiring extraordinary precision.

With the recent advent of newer type e-beam lithography devices it has become increasing more likely that such devices may be used to pattern wafers on a more substantial scale. Such devices include certain Dynamic Pattern Generators (DPG's) which embody new possibilities for Direct Write (DW) using e-beam lithography. In addition to the foregoing, the invention of reflective electron beam lithography (REBL) also presents the potential for new processing technologies. One such new device is described in the U.S. Pat. No. 6,870,172 entitled "Maskless Reflection Electron Beam Projection Lithography" dated Mar. 22, 2005 which is hereby incorporated by reference for all purposes, including, a specific illustration of a REBL device.

Although such devices show tremendous potential, they also present enormous application challenges to those of ordinary skill in the photolithographic arts. One among many such challenges is a data processing challenge. Most current implementations of methods of implementing a patterned electron beam require that each separate element of a beam patterning device to be individually actuated to enable a selected portion of the e-beam to be active so that a pattern can be produced. Additionally, it is appreciated that such patterns change as an e-beam is scanned across a die surface. Thus, tremendous amounts of information must currently be processed on an element-by-element basis as the e-beam scans across a surface to transfer a pattern. Those of ordinary skill appreciate that data rates of on the order of tens of terabit (Tb) per second ($10^{+12}$ bps) are required to enable many of these technologies in order to produce a reasonable throughput. Current technologies are not able to handle such data rates in current implementations of charged particles or optical patterning devices.

What is needed is a method and apparatus for addressing these challenges and providing a reliable and fast method for processing and applying pattern data. Thus, the embodiments of the disclosed invention are disclosed with the intention of solving at least some of the existing problems in the art. The embodiments of invention present substantial advances over the existing methodologies and overcome many limitations of the existing art. These and other inventive aspects of the invention will be discussed hereinbelow.

SUMMARY OF THE INVENTION

In accordance with the principles of the present invention, embodiments of the invention relate generally to improved direct write charged-particle beam lithography and include tools and methodologies which are discussed herein. Described aspects of the invention include, but are not limited to the embodiments detailed in the following description and drawings.

In one embodiment, the invention teaches a method for writing pattern data patterns onto a substrate with charged-particle-beam direct write lithography using a selectively patterned particle beam. The method involves condensing an initial design file down to a set of profiles and a pattern of relative locations to form a formatted set of records (e.g., a formatted pattern file). Adjusting the formatted set of records to accommodate desired pattern corrections. Extracting portions of the formatted set of record to form data streams (e.g., data strips) that have a plurality of channels, each with a pattern of profiles and spatial indicators. Sequentially reading the data streams to construct a printable pattern of profiles and spatial indicators that specify the locations of the profiles. Sequentially printing the pattern of profiles from each data stream onto a substrate to form the desired pattern on the substrate.

In another embodiment, the invention teaches a process for conducting maskless lithography to form a pattern on a substrate using a dynamic pattern generator. The embodiments involve storing a set of profiles on a dynamic pattern generator. Receiving a formatted set of records at the pattern generator as a pattern of profiles and pointers that define distances between the profiles. Extracting portions of the formatted set of record with electronics of the pattern generator and converting the extracted portions into data streams comprising a plurality of channels with each channel having a pattern of profiles and pointers. Sequentially loading the data streams as rows of pixelized instructions into a FIFO logic execution stack of the pattern generator. Sequentially executing the rows of pixelized instructions as they advance through the FIFO stack sequentially executing rows of pixel elements to achieve a desired pattern definition in the target being patterned with the pattern generator.

In an apparatus embodiment, a reflection charged-particle beam lithography system comprises the following elements. A movable stage for holding a target. Processing electronics that enable the condensing of an initial design file down to formatted set of records comprising a set of profiles and spatial locations for the profiles and also enabling adjusting the formatted set of records to accommodate desired pattern corrections. A charged-particle beam source arranged to direct a beam through a beam separator (e.g., a suitable prism-like device) onto a dynamic pattern generator (DPG). The DPG includes a pixel array and control electronics. The DPG control electronics are configured to store profiles generated by the processing electronics, operate a pointer set suitable for identifying positions for the profiles; extract portions of the formatted set of records to form a plurality of data strips that each comprise a plurality of channels with each channel comprising a pattern of profiles and pointers, and sequentially read the data strips to reconstruct the initial design file as a printable pattern of profiles and pointers that specify the locations of the profiles. The pixel array is configured to sequentially print said pattern of profiles from each data strip onto a substrate at locations specified by the pointers.

These and other aspects of the present invention are described in greater detail in the detailed description of the drawings set forth hereinbelow.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DESCRIPTION OF SPECIFIC EMBODIMENTS

Aspects of the present invention are particularly shown and described with respect to certain embodiments and specific features thereof. The inventors point out that the embodiments set forth herein below are to be taken as illustrative rather than limiting. It should be readily apparent to those of ordinary skill in the art that various changes and modifications in form and detail may be made without departing from the spirit and scope of the invention.

The following detailed description describes various methodologies and embodiments that can be employed to transfer a pattern on to a substrate using a direct write process with a patterned charged-particle beam. In general, the present invention encompasses charged-particle beam direct write lithography apparatus and methods for their use in generating patterned targets which can include, but are not limited to, semiconductor wafers and masks, as well as other surfaces capable of pattern transfer with a charged-particle beam.

Figure 1:
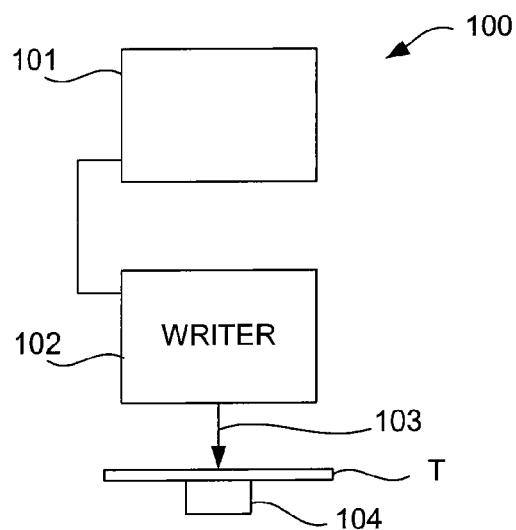
FIG. 1 is a schematic depiction of an electron beam direct write photolithography apparatus embodiment constructed in accordance with the principles of the invention.

FIG. 1 is a schematic depiction of one example of a direct write system that can be used to conduct direct write electron beam lithography in accordance with the principles of the invention. The system 100 generally includes a main patterning processor (which can be, for example a supercomputer with a parallel processing array (PPU) or other type of processing electronics) 101 in communication with a writer 102 that projects a patterned charged-particle beam (the inventors note here that the particle beam can be an electron beam, but specifically point out that the invention is not limited to such e-beam) 103 onto a target T which is moved using a stage 104.

One particular deficiency encountered in known systems is pattern writing speed. Heretofore, known systems have been hampered by their inability to transmit the amount of data required to make particle beam pattern generators functional at a high enough rate of speed. Accordingly, there is a need for devices, systems, and methods enabling a high rate of speed in writing a pattern to a surface. Among other things, this patent discusses numerous data processing issues enabling the acceleration of the write speed at which devices can write patterns to a surface. Thus, the inventors have discovered new techniques apparatus and approaches that enable 100-fold (or more) increases in data processing speed and efficiency.

The system 100 includes a processor 101 that is capable of storing, processing, and communication information between the various devices and interfaces of the system 100. The processor stores an initial design pattern (also referred to as an initial design geometry) that captures the intended pattern configuration. The initial design pattern can be a CAD file or any other type of pattern file known to those having ordinary skill in the art. Commonly, the pattern is a semiconductor die pattern but is not limited to such. Again, the processor 101 includes processing, interface, and memory circuitry sufficient to enable processing in accordance with the teachings made herein. In one implementation the processor 101 comprises a supercomputer including a parallel processing unit.

The system 100 also includes a write system (writer) 102 in communication with the patterning processor 101. The writer 102 is configured to produce a patterned particle beam 103 that is directed onto a target T. Typically, the writer 102 has electronic circuitry configured to process and store information enabling pattern formation and control of patterning arrays that form part of such writers. In particular, the writer 102 is configured to receive data from the patterning processor 101 enabling the writer to modify the charged particles of beam 103 to obtain a desired optical pattern for projection onto the target T surface. The electronics of the writer 101 generally receive instructions from the patterning processor 101 and conduct high efficiency processing to alter features of the writer that enable a specific pattern to be impressed upon the charged particle beam 103 projected onto the target T. Commonly, the target is a solid substrate, and in particular, the target is a wafer substrate, but is not limited to such.

One of the most important features of the writer 102 is its ability to effect a pattern onto a particle beam to produce a patterned charged particle beam 103. The inventors point out that the data processing methodologies taught herein are broadly applicable to other patterning approaches capable of producing a charged particle beam and such can be used in accordance with the principles of the invention. Accordingly, the invention is not limited to the examples presented below.

In one example, as described above, a REBL device can be employed as a part of the writer system 106. One such embodiment is described in the U.S. Pat. No. 6,870,172 to Mankos et al described above and incorporated by reference here. This involves directing a charged-particle beam onto a dynamic pattern generator (DPG) which also has an array of selectively activatable elements that are employed to effect changes in the pattern of the incoming e-beam to produce a patterned e-beam that is directed onto the target T. Charged-particle patterning devices include, but are not limited to, MEMS devices, DPG devices, as well as other such charged-particle beam patterning devices incorporating large numbers of actuatable elements that configure an output particle beam. The inventors specifically contemplate and point out that such beam patterning is not limited to only these referenced devices and approaches. Moreover, the principles of the invention are general in nature and are not limited to just these disclosed embodiments.

Additionally, the target T (wafer) is mounted on a stage 104 that enables different portions of the surface to have patterns projected onto it. A raster style stage can be used. Additionally, the disclosed embodiments find particular utility when used with a non-raster style stage (e.g., rotary) having a substrate rotated at a controlled speed while the charged-particle beam is scanned over the surface to achieve patterning. A non-raster stage presents certain data processing challenges that are addressed by certain embodiments latter in this patent.

Figure 2:
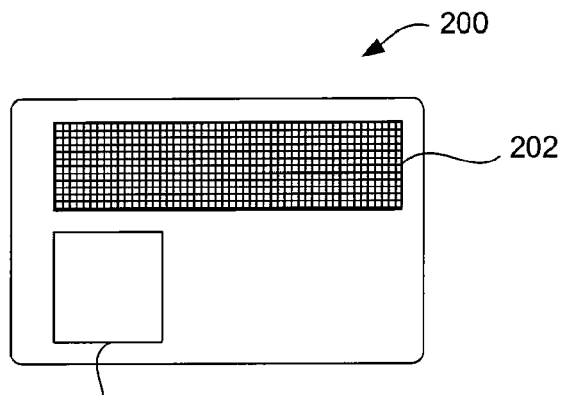
FIG. 2 is a schematic depiction of an electron beam direct write photolithography pattern generator of a REBL type suitable for patterning a substrate in accord with the principles of the invention.

Although many charged-particle beam patterning devices can be used in accordance with the principles of the invention the following discussion, for reasons of clarity, will predominantly refer to a REBL type device having an electron beam pattern generator described briefly with respect to FIG. 2.

FIG. 2 is a simplified schematic depiction of one example of an embodiment of a dynamic pattern generator (DPG) that can be used to produce a finely detailed charged-particle beam projected pattern. The DPG 200 is generally (although not exclusively) formed on a single die. The die includes processing, storage, interface, and other functions encapsulated in IC circuitry 201 comprising, for example, an application specific integrated circuit (ASIC). The circuitry 201 can include electro-optic circuitry and devices and is in communication both with the patterning processor element 101 and also with patterning array 202. Both electrical and optical links can be used to establish such communication. It is pointed out that, since the DPG is commonly in a vacuum (due to the nature of charged particle beam operations), the cooling available to on-chip electronics (e.g., 201) is limited, thus the most intensive and sophisticated processing is done by the off-chip processor 101.

The patterning array 202 comprises an array of many small pixels (ranging in size from many nanometers (nm) to several micrometers (μm) in size). The pixels (alternatively refer to herein as pixel elements) are selectively actuated to either absorb or reflect charged particles from an incident particle beam (e.g., beam 103). For example, an unpatterned charged-particle beam is directed onto the array 202 where the selective actuation of the pixels selectively impresses a pattern onto a resultant patterned particle beam, which is then directed as a patterned beam onto a selected portion of a substrate. The beam is scanned over the target to transfer pattern to the target surface. Additionally, because the target surface has many different features the beam is subject to constant change as it passes over the target.

The array 202 can be of any size, but typically contains millions of such pixels. In one example, the array is about 12,000 pixels wide and about 500 pixels deep. Other arrays can have fewer or many more such pixel elements. In the prior art, feeding data to each of these pixels (which are ever changing) requires data transfer rates on the order of terabits per second in order to achieve pattern writing of any reasonable speed level. This is simply beyond the capacity of any known on-chip electronics, indeed it is beyond the capacity of virtually any current systems. Thus, the prior art approaches were not practical, much less commercially viable.

The inventors have devised a data processing approach that not only solves the existing problems, but does so in a way that can be implemented using the current state of the art technology.

Figure 2A:
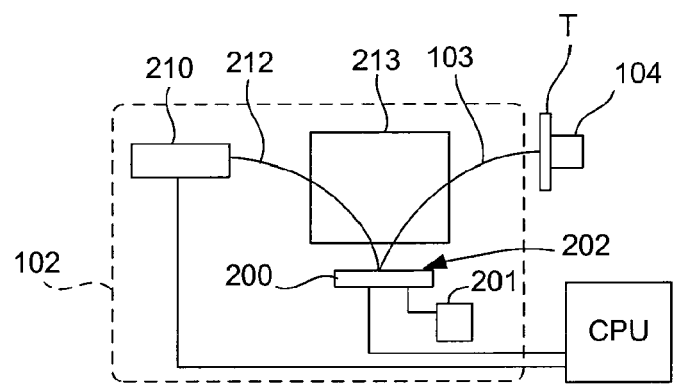
FIG. 2A is a schematic depiction of a REBL patterning device suitable for generating patterned substrates in accordance with the principles of the invention.

FIG. 2A provides one example of a tool suitable for accomplishing maskless photolithography in accordance with certain embodiments of the invention. In one application a tool similar to a reflected electron beam lithography (REBL) machine can be employed. As mentioned previously, an example of this approach is disclosed in detail in U.S. Pat. No. 6,870,172 to Mankos et al., entitled "Maskless Reflection Electron Beam Projection Lithography".

FIG. 2A illustrates schematically how this approach works. A writer 102 is controlled by a processing device 101 to direct a patterned charged particle beam 103 onto a target T. A charged particle source 210 produces an unpatterned beam of charged particles 212 at high bias (e.g., about 50 kV in one example). This beam of charged particles 212 is directed through illumination "optics" configured as charged particle optics for receiving and collimating the charged particle beam 212. Commonly, the illumination optics require an arrangement of magnetic and/or electrostatic lenses configured to focus the electrons into electron beam 212 that is directed into a "magnetic prism" 213 (or other beam separator arrangement) that redirects the electron beam 212 through objective optics onto a dynamic pattern generator (DPG) 200.

The magnetic prism 213 is typically a beam separator for deflecting the electron beam 212 in a direction perpendicular to its initial trajectory so that it is bent towards an objective lens (not shown here) and more importantly onto the DPG pixel array 202 of the DPG 200. This can be effectuated by using substantial magnetic fields configured in an arrangement capable of deviating the charged particle beam in the desired direction.

The charged particle beam 212 is then incident on the DPG pixel array 202. Such DPG pixel arrays generally comprise an array of addressable pixels. Such pixel arrays generally comprise an array of dynamically addressable conducting pads. Such pad arrays can comprise an array of several million pixels if desired. A voltage level is controllably applied to the conducting pixels to selectively reflect or absorb the charged particles of the beam. For example, in areas of the pattern where no electrons are required, a positive bias can be applied to the metal contacts and the incident electrons will be absorbed by the array 202. Whereas, a negative bias can be applied to "reflect" the electrons away from the array 202. Thus, by selectively actuating the pixel elements of the array a patterned charged particle beam 103 can be generated and be controlled.

Commonly, a beam extraction component of an objective lens (not shown here) provides an electron extraction field in front of the separator 213 (e.g., electron prism). As the reflected charged particles 103 leave the array 202, the objective optics accelerate the reflected charged particles toward a second pass through the separator 213 which bends the trajectories of the reflected electrons toward projection optics an then onto the target T. As indicated above, the target T is mounted on a movable stage (linear, rotary, or another type of stage). The apparatus typically configured to demagnify the beam 103 and focus the patterned electron beam 103 onto a photoresist layer of a target (e.g., a wafer or mask). In this fashion, a desired pattern can be transferred onto the target (e.g., a layer of photoresist).

Figure 3:
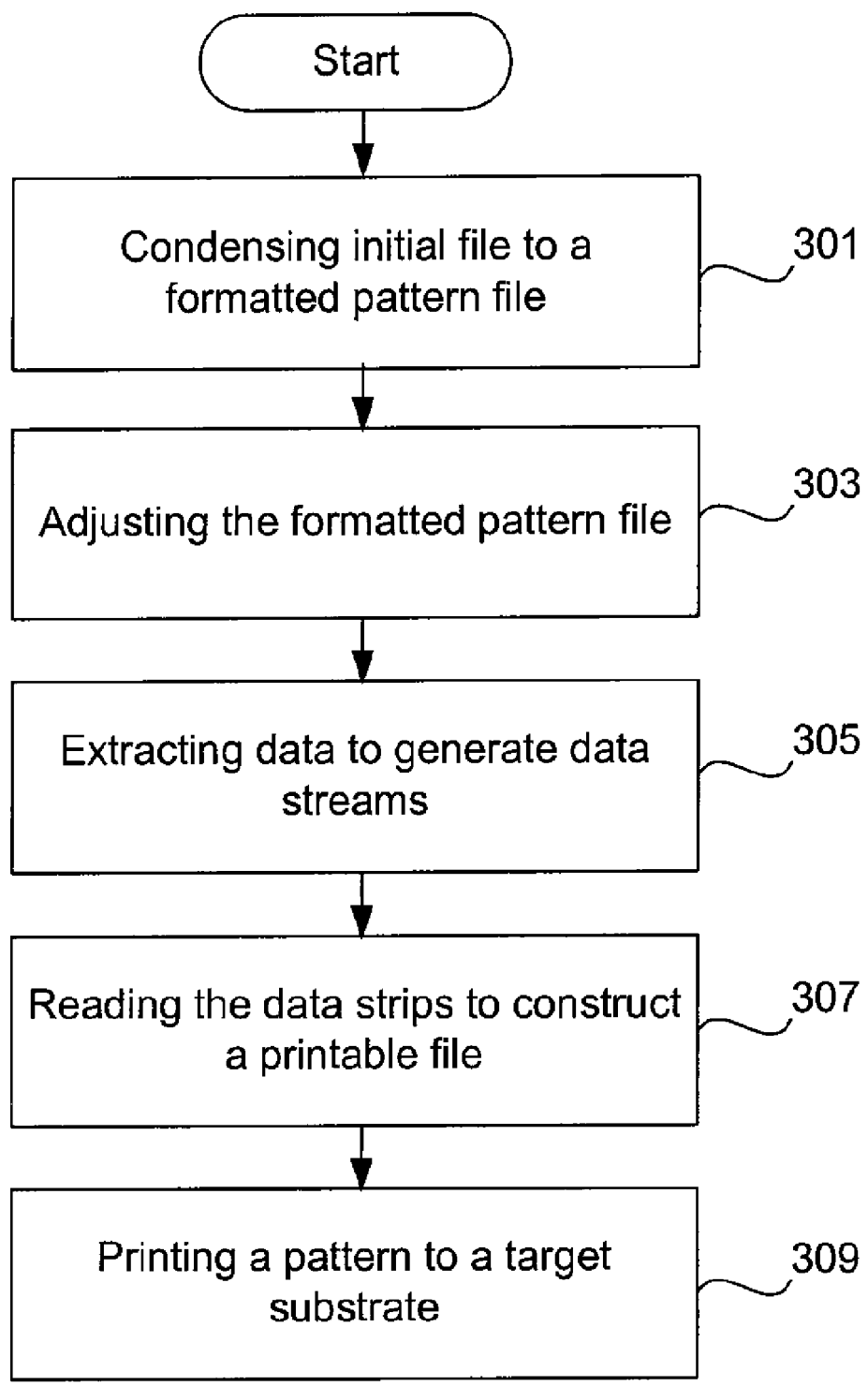
FIG. 3 is a simplified flow diagram illustrating a method embodiment used to perform a charged-particle beam direct write embodiment method in accordance with the principles of the invention.

FIG. 3 is a simplified flow diagram that illustrates one embodiment of the invention. The embodiment includes condensing an initial design file to form a formatted set of records file (Step 301), adjusting the formatted set of records to correct for pattern alterations (Step 303), extracting data from the formatted set of records to generate a plurality of multi-channel data streams (Step 305) (which can be configured as data strips), sequentially reading the data streams to construct a printable pattern enabling the printing of the pattern embodied in the initial design file (Step 307), and sequentially printing the printable pattern onto a substrate (Step 309).

The process begins with the initial design file. Generally, this is a representation of desired pattern as it is to be printed onto the substrate. Commonly, this is a CAD file or some other rendition of the pattern to be replicated. In a typical implementation the initial design file is a computer readable representation of the design of a layer (or many layers) of a semiconductor die pattern.

This initial design file by itself in its original format contains too much information to be timely transferred from a CPU to a writer 102 in its native format. Additionally, such files are simply too massive to be timely loaded, processed, and executed by the writer to generate a pattern on the target surface. Accordingly, the inventors have invented a process for condensing this initial design file into a more timely processible type of instructions that is more easily interpreted by the writer. The inventors have made advantageous use of the fact that die design patterns typically make use of numerous highly repetitive topological features. Additionally, these features are often of relatively the same size. Additionally, the features are not separated by an infinite range of distances, but rather are generally separated from each other by a small range of pre-specified "allowable" pitches (perhaps 6 or 7 pitches are all that will be used over an entire die). For example, a die might be configured with an array of vias. But the vias are not generally random in size and position. Instead they generally conform to a pattern. For example, in one example pattern, an array of vias is configured so that the vias are sized at about 1 μm across and arranged in a pattern so that each via is separated from other vias of the pattern by 2 μm of "open" unpatterned space. In a case where such an array contained a large number of vias, each of these features (vias and spaces) would have to be read into the writer (pattern generator) one pixel at a time. That could take a very long time. In fact so long as to make such a process unusable for wafer fabrication. Unfortunately, such methods are current state of the art.

The inventors have discovered that they can make use of the repetitive pattern configurations of portions of many die to rapidly accelerate the way data is capable of being written to a substrate.

The method includes an operation of condensing an initial design file to a more time-accessible formatted set of pattern records (Step 301). In this embodiment, the initial design file is processed to determine a set of basic profiles. These profiles are uniquely determined by the nature of the specific initial die pattern (thus, each different initial pattern is capable of generating a different set of profiles). Each profile includes one or more primitive types (such primitive types being a basic building block). One particularly advantageous feature developed by the inventors is the creation of "recurrent" or "reusable" profiles. These profiles are capable of being reused at numerous locations to enable reconstruction of the entire die. Thus, a relatively small set of profiles (primitives) is defined so that, alone or in combination, the entire initial design file can be recreated. Although a preset standard set of primitives can be used, a unique set of profiles and primitives uniquely generated for each die file (either by layer or for the entire die) can also be used. Such uniquely defined sets are advantageous as they are optimized for each specific pattern.

The previously defined profiles can then be stored in a memory of the associated pattern generator for quick recall as need during pattern generation. In some implementations the profiles or primitives can be identified by associated designators which are simply pointers (e.g., indicators associated with memory addresses) that refer to the associated primitives or profiles. Additionally, a set of locators are associated with the profiles. The locators are references to the spatial positions of the profiles on the die. Thus, the entire die can be represented by a pattern of profiles (and the associated pointers) and locators. In one implementation a locator can merely be a spatial indicator (spatial pointer) that references the position of profile relative to the last profile read. This can be advantageous because the distances between surface features tend to relatively uniform (or at least selected from a narrow range of distances). Thus, pointers specifying such distances can be reduced to a very small set of instructions which are of very small size. This presents excellent opportunities for data condensation. Accordingly, an entire die pattern can be described as an interrelated chain of profiles and pointers. Thus, data streams can be constructed comprising nothing more than a chain of profile pointers and spatial pointers that identify distances between the profiles. This drastically reduces the amount and nature of the data which must be encoded and transferred to a pattern generator. Additionally, this condensed chain can be further compressed using other standard compression techniques.

Figure 3A:
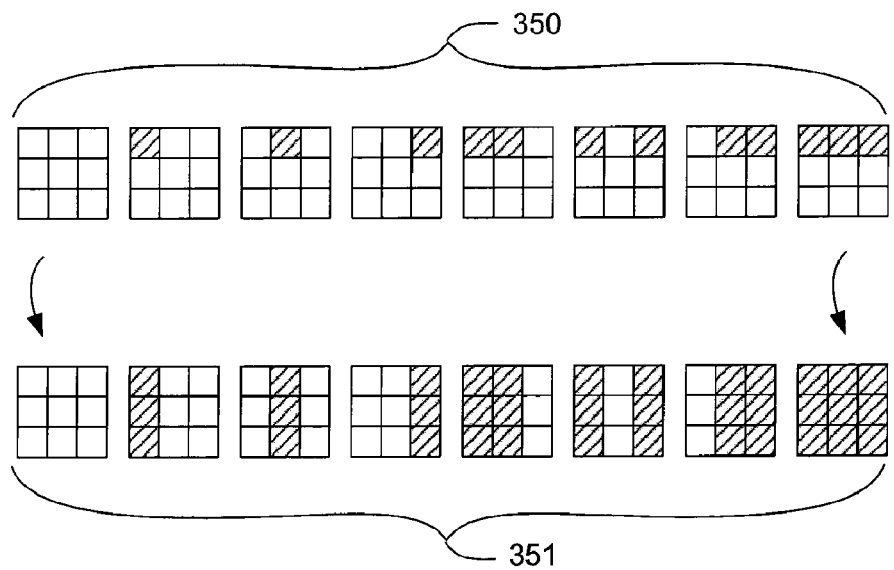
FIG. 3A is a schematic depiction of simplified set of primitives suitable for patterning a substrate using a charged-particle beam direct write photolithography process in accord with the principles of the invention.

FIG. 3A provides one simplified example of a non-limiting set of profiles that can be used to reconstruct an example initial design file. This illustration uses a set of profiles to demonstrate certain concepts involving the profiles (and associated primitives). FIG. 3A is a very simplified depiction of primitive function applied in accordance with the principles of embodiments of the invention. The depicted profiles are shown here as a set of three pixel by three pixel binary primitives. The pixels correspond to pixel elements on a pattern generation device. The inventors point out that the depicted 3×3 profile is merely arbitrary and illustrative in nature. Larger profiles or primitives (say 4×4) or even much larger profiles can be employed. The whole point being that instead of transmitting nine separate instructions specifying the status of all nine pixels, one instruction specifying the profile is all that is needed. Thus, the profile (and its location) operate as a short hand for the status of all of the pixels in the profile. For example, the eight primitives 350 (profiles) can be used to scan the eight associated patterns 351 as the primitives are scanned across a substrate surface. Additionally, the inventors point out that primitives can be combined to obtain more sophisticated feature structures. Also, during scanning, the primitives can be terminated or replaced with other primitives at any point during the printing process to obtain a vast assortment of patterns. Even more advantageously, the position of the profile need only be specified once rather than separately for each pixel (this is discussed in greater detail below).

Figure 3B:
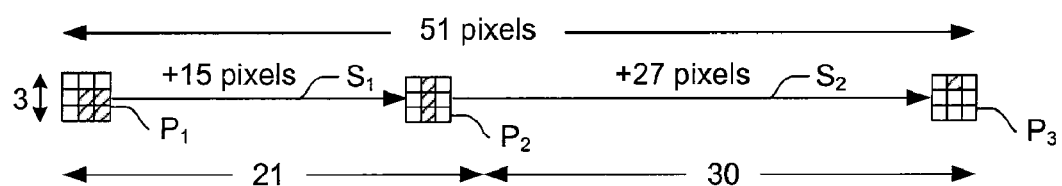
FIG. 3B is a simplified schematic depiction of a pattern of profiles and pointers used to enable pattern transfer onto a target substrate using a charged-particle beam direct write photolithography process in accord with the principles of the invention.

FIG. 3B is a simplified illustration of a representation of how a set of profiles and pointers can work together to facilitate efficient data condensation in accordance with the principles of the invention. The reader shall appreciate that FIG. 3B presents a very simplified description of a much broader concept. Here a portion of a data stream supplied to a data channel of a dynamic pattern generator (DPG) is schematically depicted. For example, the depicted portion of an executable pattern is to be executed by the pixel array of a DPG. In this example, only a small portion of the entire pixel array of the DPG is show. Here a set of pixels that is 52 pixels wide and 3 pixels deep is shown. In this depiction a location for a first profile $P_1$ is shown. Pointers are used to identify the position of the each profile in the pattern. The methods and systems used to identify position and timing for the profiles can be many and the depicted example is not intended to be limiting. In the depicted embodiment the positions are specified as relative positions. Accordingly, once the position of the first profile $P_1$ is determined, a pointer (spatial indicator) S1 is used to specify the relative position of a second profile $P_2$ relative to the position of the first profile $P_1$. In this case, the pointer S1 specifies that the second profile $P_2$ is located 15 pixels to the right of the first profile $P_1$. Similarly, pointer $S_2$ specifies that the third profile $P_3$ is located 27 pixels to the right of the second profile $P_2$. Thus, instead of having to specify the status of 151 pixels of data the same pattern is specified by 5 pieces of data (actually, probably six, by the pointer used to specify position for P1 is not shown here). The pointers can function in other associated manners as well, but the principle is illustrated here. Additionally, because for most designs distances between features are commonly of only a few discrete amounts, the pointer instructions can be formed of very small instruction words (some instructions sets having pointer instructions of 4 bits or less). Additionally, small instruction sets can be used to represent the small number of profiles that are needed to represent an entire pattern. In this way significant condensation of data is effected.

Additionally, very large profiles can be created, stored, and employed to represent large areas of the die. Such large profiles are particularly suitable for use with design patterns having a number of large recurring patterns that occur at various places on the die. Thus, the amount of data necessary to transport pattern data and pixel instructions has been drastically reduced. Additionally, the spatial pointers can be used to describe relative position between the profiles that can be identified by a set of unique designators (e.g., memory addresses) that reference the particular profile (e.g., using a pointer to a memory address) and an associated spatial pointer that describes a relative spatial location of the profile. Locations can be specified in absolute terms or specified relative to the positions of other profile types in the pattern, either are useable. However, the advantage of relative spatial position instructions is that the information can be encoded in smaller size instructions. This works well in many embodiments particularly where massive amounts of data must be transferred. In such cases, any size saving characteristics yields substantial increases in efficiency. In this way the initial design file can be defined by a set of designators that reference associated profiles (uniquely defined by the characteristics of the initial design file) and associated spatial pointers that locate the position of the profiles.

Thus, the entire initial design file can be condensed down to formatted set of records which comprises a set of profile types and a pattern of locations for the profile types. In one embodiment, the formatted set of records can be a formatted pattern file containing all of the desired profiles and pointers and may include any desired associated information. Other forms (beyond files) can be used to store or otherwise enable the formatted set of files that characterizes the desired pattern. For example, these sets of records can be in a stack or other computer readable media or device.

Additionally, the data can be compressed further by using certain abbreviated command indicators that define large spatial portions of the initial design file with small size instructions. Thus, large portions of pattern area can be described with small instructions comprising only a few data bits. Although the inventors contemplate instruction information of any size, certain small size words are particularly advantageous. In fact many applications can generate pointers and profiles of 10 bits or less. Such small instructions can be processed very quickly. Such abbreviated command indicators can include the large frequently recurring patterns described above and can also include so-called end-of-line (EOL) indicators. Such EOL indicators are used to specify that a whole line of pixels is empty past some point. This is advantageous because it allows an entire line of "empty" or "off" pixels to be specified with a single piece of information rather than requiring an entire line of empty profiles to be specified or each pixel to be individually specified as "empty". The same can be said for another type of end of line indicator (a full line indicator) that can specify that an entire portion of a line of pixels should be "on" rather than requiring an entire line of "on" profiles to be specified. Such are useful for providing compact printing instructions for many types of features such as lines and the like. Commonly, an entire set of uniquely determined profiles capable of mapping a die (or even all of the dies on a wafer) requires only a few hundred profiles. In some cases, far fewer profiles (in the range of tens of profiles) are required. Moreover, it is very uncommon for more than one thousand profiles to be required.

Figure 4A:
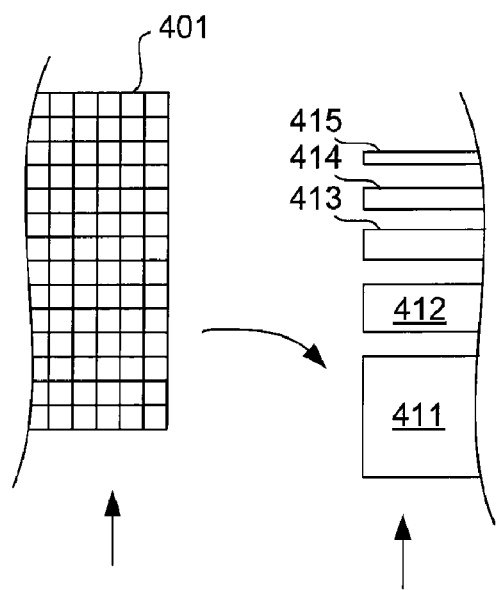
FIG. 4A schematically depicts a pattern generator embodiment described in accordance with the principles of the invention.
Figure 4B:
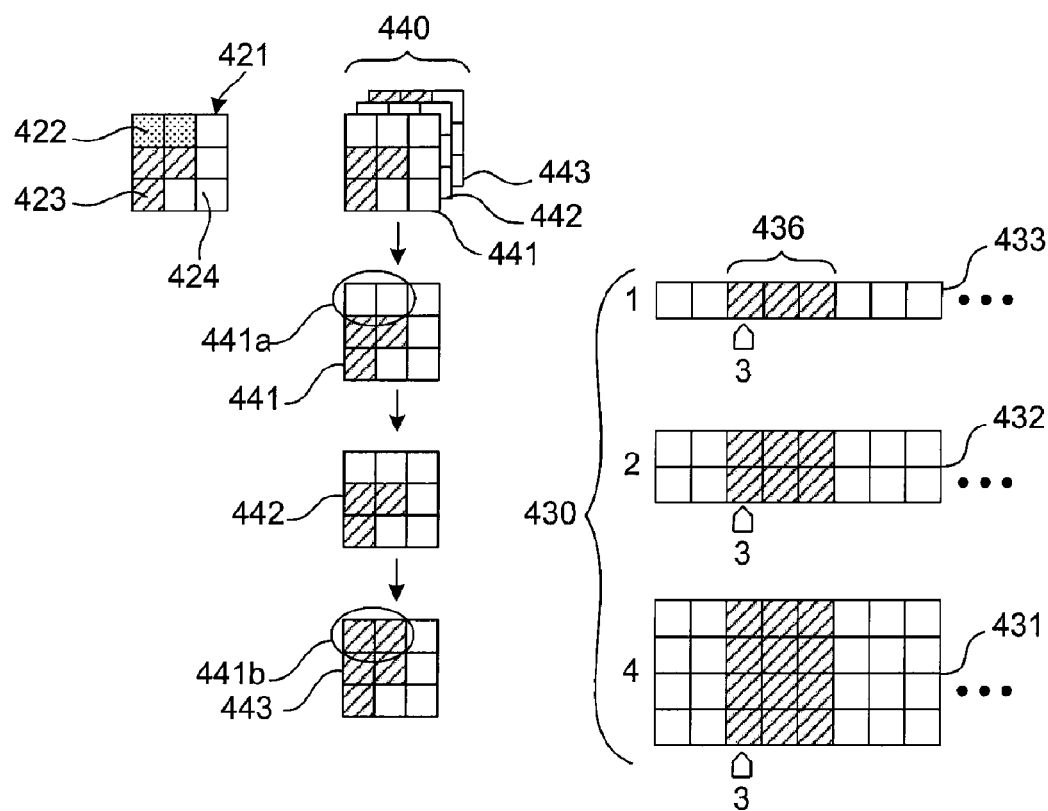
FIG. 4B is a schematic depiction describing a process for generating a grey-scale pattern on a substrate in accordance with the principles of the invention.

Additionally, the inventors have contemplated extreme positional accuracy enabled by grey-scaling the printed images made by the inventive processes. FIGS. 4A & 4B illustrate one example of how such profiles can be used to produce "grey scale" patterns. In particular, the illustrations describe one embodiment of a grey-scale profile. Due to the time dependent nature of the inventive process and associated devices, grey scaling can be achieved by varying the exposure times of the various pixels. All of this of course is dependent on the nature and type of photoresist materials employed (i.e., positive or negative photoresist, effective exposure thresholds, photoresist sensitivities, and so on). Additionally, because grey-scaling portions of a target depends on time of exposure (time integration), the order of exposure is not particularly important. This leads to several advantageous implementation embodiments.

For one, if a charged particle beam pattern produced by a pixel array is used to expose a target, the processing of instructions by the pixel array can be controlled in a manner that enables the target surface to have various different grey levels. FIG. 4A depicts, in simplified figurative form, a portion of a pixel array used to pattern a charged particle beam. The pixel array 401 embodiment shown depicts an array at least 31 pixels deep and can be used to define 32 levels of grey with a single 5 bit instruction. This can be implemented by varying the start times of various patterns to enable a final exposure profile having the desired grey scaling. In this example, the depth of the DPG is used to govern the exposure time, as the pattern is clocked synchronously with the stage.

For example, as depicted in FIG. 4A, a pixel array 401 at least 31 bits deep is processed in digital pixel blocks for each profile. The same array is schematically depicted as a series of pixel blocks or segments. A first block of pixels 411, perhaps defined by the most significant bit (MSB) of a 5 bit grey scale instruction defines perhaps a block 16 pixels deep. A second block of pixels 412, defined by a second grey bit of the 5 bit grey scale instruction defines perhaps a block 8 pixels deep. A third block of pixels 413, defined by a third grey bit of the 5-bit grey scale instruction defines perhaps a block 4 pixels deep. A fourth block of pixels 414, defined by a fourth grey bit of the 5-bit grey scale instruction defines perhaps a block 2 pixels deep. Here a fifth (or last) block of pixels 415, perhaps defined by the least significant bit (LSB) of the grey scale instruction defines a block a single pixel deep. It is pointed out that pixel arrays of greater depth can be used to produce grey scaling of much more fidelity and definition if desired. The inventors merely use a single example to illustrate a much broader general concept. It is also pointed out that the blocks are separated from one another in processing terms, but are commonly contiguous in a physical sense on the array.

Referring to the depicted example, if a user desires a full "grey scale" portion of the image (fully exposed), appropriate portions of each row of the entire pixel array (401, also depicted as 411, 412, 413, 414, 415) are used to expose the target. Additionally, if a user desires only a half grey scale exposure (half exposed) of a portion of the target, then appropriate portions of the half the pixel array are used to expose the target. But, rather than repeatedly activating and deactivating selected pixels, entire segments are activated as needed. This creates much simpler and more compact instruction sets. Due the data bandwidth limitations of the system, this is a very advantageous feature. For example, to establish a one half grey scale image, the user need only activate the desired portions of the array (e.g., corresponding to segment 411) to direct the electron beam onto the appropriate portions of the target. Thus, the indicated portions of the target will only receive half the dose as the portions being exposed to all rows of the array.

One example of a profile enabling the formation of a grey-scaled feature is now described with respect to FIG. 4B. The intended printed appearance of the desired feature 421 is depicted. The pattern of the depicted in the feature has some pixels exposed at half grey scale (½ scale pixels 422), some pixels exposed at full grey scale (black or fully exposed pixels 423), and some unexposed pixels 424. This pattern can be replicated with a pattern generator using inventive methodologies. The depicted pattern generator 430 is schematically represented using a simplified seven-row configuration (although shown here as segmented, the seven rows of pixels are contiguous in the actual pattern generator). As an appropriate profile passes through each row of the pattern generator it can be used to generate the desired feature 421.

Each feature can be fabricated by using one or more of the profiles that were generated earlier. Here, a profile 440 can be represented by the depicted primitives (441, 442, 443). Profile 440 can be used to generate feature 421 using the process described in the following example. Here, primitive 441 progresses line by line through a portion of the pattern generator, beginning, in this example, at row 443 of the pattern generator. It is noted here that the pixels 441a will not print any image data as it is scanned through row 441. The profile 440 passes into segment 432 of the generator 430 where a similar pattern is printed onto the target by primitive 442 (which, in this case, is the same as 441, incidentally offering further opportunities for data compression). The profile next advances through segment 431 of the generator 430 where a different primitive pattern is printed onto the target by primitive 443. The primitive 443 prints all of the same pixels as 441, 442 to obtain full grey scale of those pixels. However, added pixels 441b (which correspond to 441a) are also printed by the rows of pixels associated with segment 431. But since these pixels are only printed at four of the seven time frames, they are approximately half grey scale. Those of ordinary skill appreciate that this limited explanation and this example can be easily expanded to capture further methods of obtaining grey-scale images. The inventors intend that many levels of grey scale can be easily achieved using the profile and pattern generator processing concepts just described. Additionally, the inventors point out that the primitives need not be advanced through every row of a segment but can be substituted with other primitives to obtain desired shapes and grey scales. For example, a profile need not be advanced through all four rows of segment 431, but can be replaced with a new profile (or terminated altogether) at any time during the processing to effectuate a desired target image. Such grey-scaling can be used to print images having angstrom level resolution and positioning.

For example, if the feature 421 is intended to be formed on the target at a position that corresponds to a location 3 pixels over (to the right) of the left edge of the depicted portion (e.g., channel) of the pattern generator this path can be identified by a pointer (schematically depicted for example by 435 which indicates a relative position of the profile. The profile passes through each row of pixels of the patterning device (see, the shaded column of pixels 436) until terminated. This enables information for large numbers of pixels to be simply encoded using a few profiles and a few pointers to vastly reduce and simplify the data instructions processed by the patterning device (here dynamic pattern generator). A next pointer can be used to specify a distance from one profile to a next profile. Thus, the use of a pointer removes the need to individually specify an activity for the intervening pixels (which commonly print nothing) between two profiles or an EOL indicator or full line indicator or other activity indicator can be employed to effectively reduce the number of instructions required (thereby further compressing the data).

In some implementations, condensing the data can be further supplemented by the addition of compression processes (LZ-like (Lempel-Ziv) data compression, LZW, DEFLATE, zip file compression, and many others known to those having ordinary skill in the art). Additionally, such data compression can be implemented elsewhere as part of the data condensing process.

Returning to FIG. 3, the formatted set of records can be adjusted to correct for pattern alterations (Step 303). For example, the pattern can be aligned with the previously formed layers already formed on the substrate. This can be accomplished using ordinary alignment processes and techniques known to those having ordinary skill in the art. Commonly this will be accomplished by shifting the positions of the primitives or pointers until a desired alignment is achieved. Additionally, the formatted set of records can be adjusted to counteract the effects of materials and structures formed on the previously formed layers. These underlying areas and particular materials can affect the pattern configuration of the charged particle beam. However, these topologically induced deviations from the intended pattern can be corrected by methods known to those having ordinary skill in the art. In one example, different profiles can be employed to achieve the desired pattern, being integrated sequentially. One example is discussed briefly with respect to FIG. 5 below. In any case, different patterns, profiles, primitives, spacings, or arrangements can be used to correct for the effects of adjacent or underlying materials and thereby correct the pattern back to the desired pattern thereby accounting for the effects of the underlying layers. Also, the effects of charged particle pattern blurring can be corrected for (e.g., the effects caused when the pattern density becomes too high and electron-electron interactions "blur" the pattern to reduce fidelity).

Figure 5:
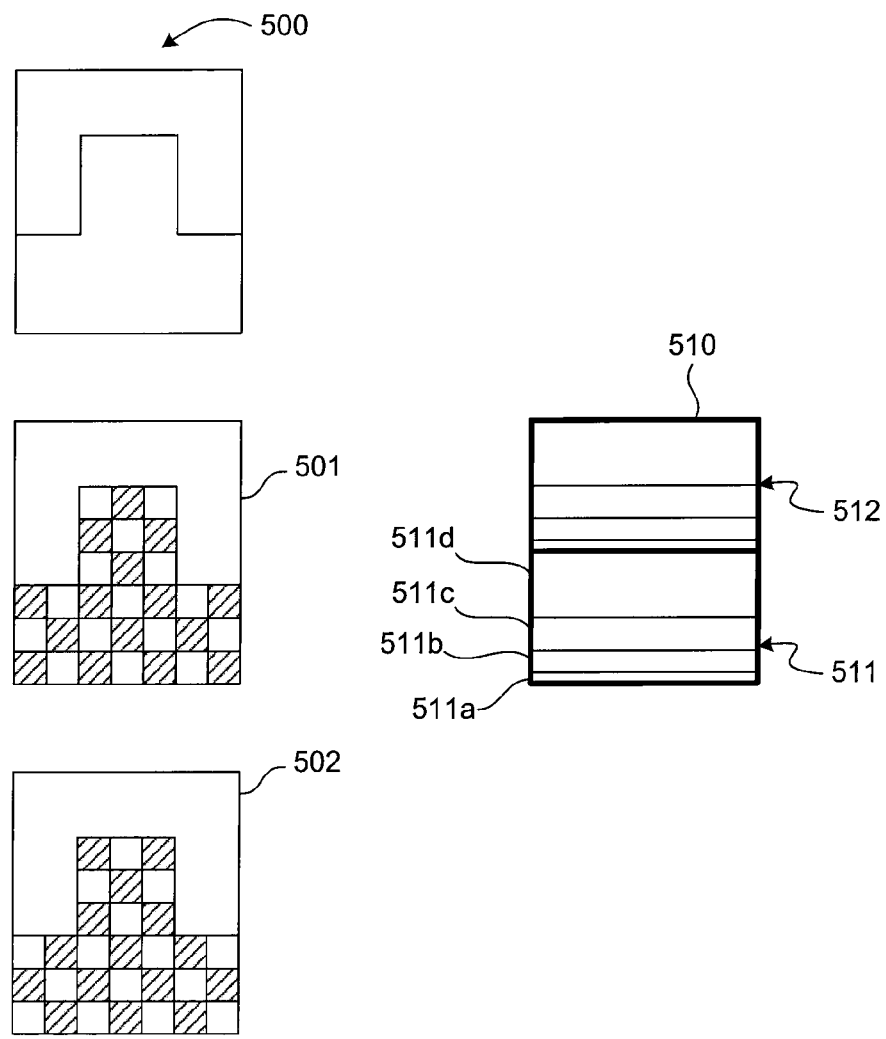
FIG. 5 is a schematic depicts one possible inventive approach for addressing pattern variability issues and presents one possible adjustment capable of reducing image blur associated with high charged particle beam densities.

FIG. 5 provides one example of a method that can be used to obtain pattern correction to correct for blurring due high electron beam density. The desired pattern 500 can be produced by using inverse TDI patterns 501 and 502. Each of the patterns 501 and 501 has a lower electron density than, for example, the one depicted in 500. Thus, each of these patterns will be subject to less electron pattern blurring than 500. It is to be noted that the patterns 501, 502 have an alternating pattern of activated (e.g., dark) pixels and unactivated (e.g., light pixels). Therefore, by aligning the substrate and exposing it to both patterns for a time sufficient to fully activate a photoresist, the pattern 500 can be produced with reduced blurring. This can be implemented in a number of different ways. One non-limiting example is briefly described as follows. A writer 102 having pattern generator 510 operates to selectively use both patterns 501, 502. The pattern generator operates much like that described above with respect to FIGS. 4A & 4B. The pattern generator 510 can be configured in segments just as the previously described pattern generators (e.g., 430). In the depicted embodiment, the pattern generator can be processed in two associated groups. For example, the first pattern 501 can operate by passing through a first group 511 of the pattern generator 510. The second pattern 502 then passes through the second group 512 of the pattern generator 510. Each of the groups 511, 512 of the pattern generator 510 can be configured in segments (depicted schematically here as, for example, 511a, 511b, 511c, 511d) just as the previously described pattern generators (e.g., 430). Pattern 501 may be achieved by processing the patterned through each segment of 511 to fully expose the pattern. Similarly, pattern 502 can be processed through each segment of group 512 of the pattern generator 510 to fully complete the pattern 500. The inventors contemplate that many other methods of reducing pattern blur caused by high electron density can be alleviated using the present invention to generate patterns of lower electron density but longer exposure time.

In some implementations, the die patterns are scanned through a writer in a raster scan mode of operation to implement and otherwise pattern the surfaces. However, in another approach, the inventors contemplate that the charged particle beam is scanned over the target as the target substrate is rotated in a circular or spiral pattern. Although such a methodology presents numerous process advantages, it also creates a few challenges addressed by the inventors below. For one, the standard wafer pattern is configured with a plurality of dies arranged in columns and rows. Such a pattern of rows and columns requires certain adjustments if the patterning beam projected onto the target substrate follows a circular of spiral pattern. Conveniently, the inventors have discovered that the spiral pattern can be thought of as a slightly offset linear pattern. Over short distances (such as are defined by the swaths described herein) the path followed by the charged particle beam for a rotating target is at an angle, but nearly straight. Additionally, because the formatted set of records comprises a pattern of profiles and pointers, the encoded data can be adjusted slightly to accommodate the shifts and changes in the pattern as printed. Thus, the pattern can be adjusted asynchronously prior to being processed by the pattern generator enabling the time intensive conversion of the pattern to be performed "off-line" where it does not slow the process. Alternatively, and in many cases preferably, the pattern can be adjusted synchronously by the pattern processor (e.g., 101) on an "as needed" process with a small lead time enabling the pattern processor to adjust the pattern immediately before patterning. Accordingly, the adjusted pattern file can be used to form the same pattern on the surface despite being formed on a rotating wafer.

Figure 6:
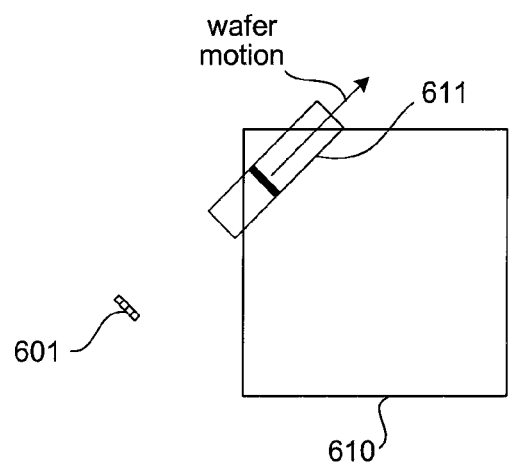
FIG. 6 is a simplified schematic depiction of an aspect of a process embodiment capable of enabling direct write onto a rotating substrate to effectuate charged-particle beam direct write in accordance with the principles of the invention.

This is schematically depicted using FIG. 6. 610 schematically depicts a die pattern encoded as a pattern of profiles and pointers. 601 defines a width of a pixel array of a pattern generator that will be used to pattern the die 610. Swath 611 defines the path followed by the pattern generator as it passes across the die 610 as it writes the pattern to the wafer. The inventors note that the pattern on the die 610 can be rotated or otherwise converted (if need be to a new set of primitives and pointers) to a format that is compatible with the swath 611 cut by the pattern generator 601 as it passes through the die. This converted pattern information is generated just before the pattern is written with the pattern generator. Thus, the pattern rotation calculations and adjustments are done by the pattern processor (e.g., a PPU) immediately before the time of writing to the substrate. This is made possible by simplifying the instructions to a set of simplified pattern of pointers and profiles. A consequence of this simplification is a significantly reduced burden on the pattern generator thereby enabling the rapid conversion and writing of pattern to the substrate.

As indicated above, once the patterns have been condensed and adjusted asynchronously (including pattern rotation primitives which can be applied synchronously by the pattern generator) they are stored in a buffer where they can be accessed as needed by the pattern generator.

This information is then selectively extracted and formulated into data strips that will be implemented by the pattern generator to form the pattern on the substrate. In one implementation, portions of the adjusted formatted pattern file are extracted by the electronics of a pattern generator and converting into a plurality of data strips. During extraction, each data strip is generally extracted as a series of contiguous data channels with each channel comprising a pattern of profiles (or designators that identify the profiles) and spatial information (for example, in the form of pointers) or other small size pattern instructions (EOL indicators, large pattern indicators, and so on). Once extracted, the data is formulated into data strips that can be as many pixels wide as the pattern generation array and commonly a profile (or more) deep.

In one embodiment, a pattern generator can be about 12,000 pixels wide. Accordingly, the data can be extracted from the formatted file in data strips 12,000 pixels wide. Typically this achieved by extracting the data as a series of adjacent and parallel data channels. For example, the pattern generator can be configured as a plurality of channels of a desired width to define a number of pattern generator blocks. For example, the pattern generator can be configured a series of blocks 64 pixels wide. Accordingly, the data could be extracted from the file as a plurality of 64 pixel wide data channels (in one example, about 190 channels). The data strips can be configured of any size, but it is convenient to set them to a have a depth of, for example, one profile (primitive) deep. This multi-channel configuration is advantageous because it enables many channels to be fed into a processing stack of the pattern generator simultaneously to maximize efficiency of the pattern generator processing circuitry. The pattern processor (e.g. off chip PPU 101) extracts data streams one at a time, sequentially writing them to a serial buffer (which can be located in the on-chip electronics 201) at the pattern generator. The pattern generator then synchronizes them into a processing stack (which can be an on-chip processing stack of 201), and then executes the stack by writing selected profiles to the substrate. This sequential implementation prevents the data from overwhelming the processing capabilities of the pattern generator.

The inventors point out that implementation embodiments of the invention can prevent discontinuities at the interfaces between two adjacent channels. This potential for discontinuity can occur when a profile extends beyond one end of a first channel and extends into the adjacent channel. In one embodiment this discontinuity is resolved by extending one channel to encompass the entire profile and shortening the adjacent channel to compensate. Also "glue" pixels can be used at the end of channels to integrate adjacent channels together with each other. Such glue pixels operate as boundary features and are generally connected using OR instructions. Additionally, locks are used to prevent two end segments from inadvertently overwriting each other.

The data strips are then sequentially read into an execution stack (execution buffer) of the pattern generator to enable reconstruction of the pattern information of the initial design file as a printable pattern of primitive types and the locations of the types for each data strip (Step 307). Generally, the execution stack is a simple first in first out (FIFO) buffer, but the inventors contemplate other buffer configurations as well.

The pattern generator then operates to impress the pattern onto an electron beam to sequentially print the pattern of profiles from each data strip onto the appropriate locations of the substrate to pattern the substrate in accordance with the initial design file (Step 309).

Figure 7:
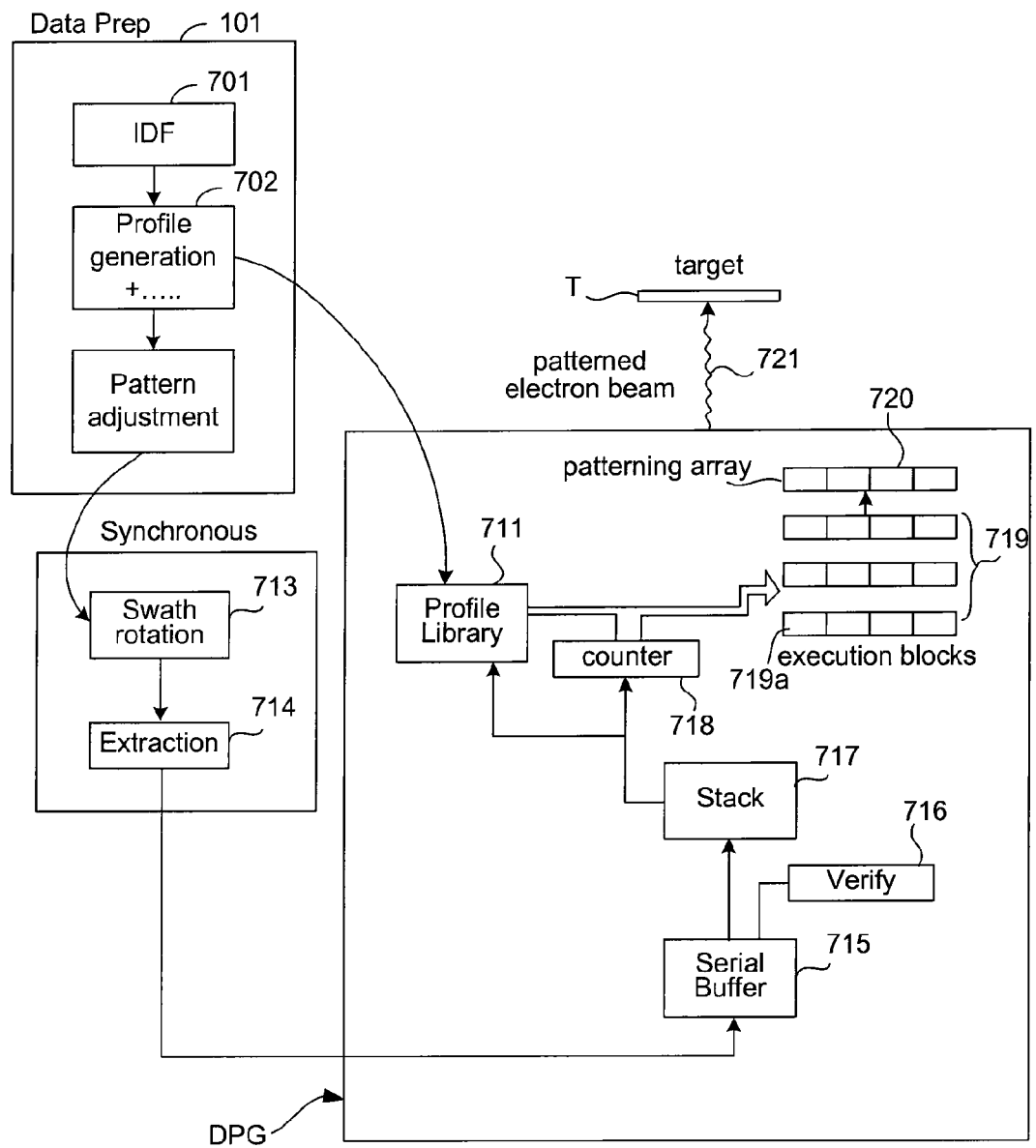
FIG. 7 is simplified schematic depiction of a data processing embodiment of the present invention.

FIG. 7 is a schematic depiction of a system used to pattern a substrate and a process embedment for doing so. The depicted system is analogous to that depicted in FIG. 1. The processor 101 processes the initial design file 701 to generate 702 a set of unique profiles that are stored in a library file 711 on the a dynamic pattern generator (DPG) forming part of the writer 102. The pattern adjustments are made (e.g., as in Step 303) 703 and then the formatted file is sent to the DPG of the writer 102. If needed, swath rotation (see, FIG. 6 and so on) is performed 713 at the DPG and then the data streams (strips) are extracted 714 for processing. Decompression can also be effected at the point to decompress data (such as the formatted data file and so on) that were compressed earlier using standard data compression formats (zip, LZ and so on). The data streams are loaded into a serial buffer 715 where they are stored for parallel execution. Each line of the data strip can be verified 716 for integrity (e.g., using a checksum or other verification scheme). The data strips are then sequentially loaded into stack load logic 717 of the DPG (in some embodiments verification can be performed at this stage). The data strips are then processed to retrieve profile information 711 and location information (e.g., using pointer logic 718) to be sequentially executed by the execution blocks 719*b* of the execution stack 719 which operate the pixels of the pixel array 720 to generate a patterned electron beam 721 which is directed onto the target T to achieve the pattern. The inventors point out that verification of data accuracy can be conducted at any point in the data paths described above. In particular, the data accuracy can be verified at any point against the expected data, in one particular approach, a time-tagged feedback stream of signature can be sent to the processor for verification.

Figure 8:
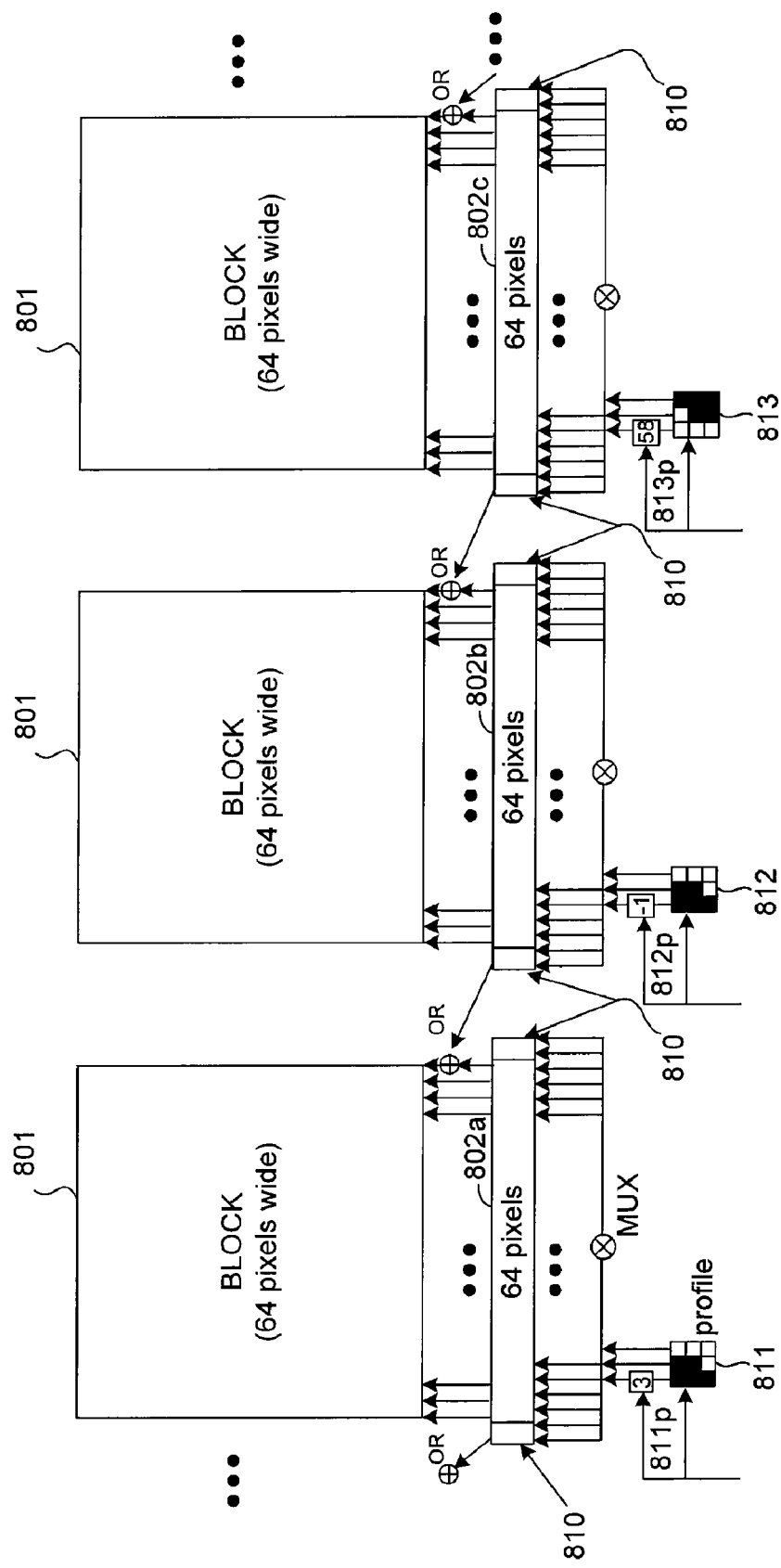
FIG. 8 depicts one embodiment of a data processing approach enabling pointer function and pattern stitching to prevent pattern overlap in accordance with the principles of the invention.

FIG. 8 illustrates a simplified schematic depiction of a portion of the process. Although, the array blocks 801 of the pattern generator are contiguous in nature they are depicted here separated for ease of explanation (constructed as an example by 64 bit blocks). The data channels 802*a*, 802*b*, 802*c* are depicted with "glue" pixels 810. A serial buffer sequentially reads a data strip (channel by channel) to receive profiles and an associated spatial indicator (a pointer) that identifies the location of the profile. This information is passed into the data channels of the pattern generator where it is mapped to the appropriate location. For example, profile 811 is mapped by a pointer 811*p* to a point 3 pixels from the right edge of the channel 802*a*. Profile 812 is mapped by a pointer 812*p* to a point −1 pixels from the right edge of the channel 802*b* thus, extending backward to capture, for example one of the glue pixels 810. The right hand pixel of channel 811 is locked to prevent two channels from overwriting the same pixel. Profile 813 is mapped by a pointer 813*p* to a point 58 pixels from the right edge of the channel 802*c* thus, extending backward to capture, for example one of the glue pixels 810. The profiles are advanced through the pattern generator block 801 pixel row by pixel row. Typically, the rate at which the pattern is advanced through the pattern generator is the same rate at which the substrate is moved. Thus, the movement of the pattern through the pattern generator tracks the motion of the substrate as it is moved relative to the pattern generator. The advantageous of the present embodiments are easy to see from the foregoing descriptions. For example, referring to FIG. 8, three profiles and three pointers are sued to specify the activity of 576 pixels ((3×64)+(3×64)+(3×64)). This can translate into a phenomenal level of data compression and radically reduce the processing burden on a system highly suited to benefit from such a reduction.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element, which is not specifically disclosed herein.

We claim:

1. A method for writing pattern data patterns onto a substrate with charged particle beam lithography using a selectively patterned charged particle beam, the method comprising:

a) condensing an initial design pattern down to a set of profiles and associated locations for the profiles to form a formatted set of pattern records, the initial design containing pattern information that defines a desired pattern of features to be formed on a die and wherein the profiles define shapes and patterns that enable patterns to be transferred to the surface during charged particle lithography;

b) adjusting the formatted set of pattern records to accommodate desired pattern corrections;

c) extracting portions of the formatted set of pattern records to form a plurality of data streams each comprising a plurality of channels with each channel comprising a pattern of profiles and spatial indicators that specify a location for an associated profile, thereby enabling the initial design data to be defined by data streams of simplified instructions;

d) sequentially reading the data streams to reconstruct the initial design as a printable pattern of profiles and spatial indicators specifying the locations of the profiles; and e) sequentially printing a pattern of profiles from each data strip onto a substrate at an appropriate location to thereby print the initial design pattern on the substrate.

2. The method of claim 1 wherein condensing the initial design pattern further includes generating abbreviated command indicators that define large spatial portions of the initial design file with small size instructions.

3. The method of claim 1 wherein the charged particle beam comprises an electron beam.

4. The method of claim 1 wherein condensing the initial design down to a set of profiles and a pattern of associated locations for the profiles to form a formatted set of pattern records comprises condensing to form a formatted pattern file.

5. The method of claim 1 wherein condensing the initial design down to a set of profiles and a pattern of associated locations for the profiles comprises condensing to a set of profiles and a pattern of relative locations for the profiles wherein each relative location is defined by a spatial pointer that identifies a position for an associated profile relative to a position of another previously specified profile to form the formatted set of pattern records; and wherein extracting portions of the formatted set of pattern records comprises extracting the pattern of profiles and the associated spatial pointers that specify the pattern of relative locations for an associated profile, thereby enabling the initial design data to be defined by data streams of simplified instructions.

6. The method recited in claim 1 wherein the method comprises a method of performing maskless lithography wherein the patterning device comprises a dynamic pattern generator (DPG) having an array of pixel elements that can be selectively actuated to modulate a charged particle beam to produce the selectively patterned charged particle beam.

7. The method recited in claim 6 wherein condensing the initial design comprises obtaining a unique set of primitive types defined by the initial design.

8. The method recited in claim 7 wherein condensing the initial design further comprises defining the pattern of associated locations as spatial distances between profiles using spatial indicators that comprise distance pointers.

9. The method recited in claim 6 wherein:

a) condensing the initial design comprises formatting the data of the initial design such that the profiles are identified by designators that correspond to an associated profile and the positions of the profiles are described by pointers wherein lines of data are generated that include designators and pointers configured such that the pointers describe the distance between adjacent designators thereby enabling long lines of data to be defined by small groups of simplified instructions that form the formatted pattern file.

10. The method recited in claim 7 wherein: b) adjusting the formatted set of pattern records to accommodate desired pattern corrections includes adjusting to account for die specific local effects.

11. The method recited in claim 10 wherein: b) adjusting the formatted set of pattern records to account for die specific local effects includes aligning the formatted set of pattern records with underlying layers formed on the substrate.

12. The method recited in claim 10 wherein: b) adjusting the formatted set of pattern records to account for die specific local effects includes adjusting the formatted pattern file to account for underlying and adjacent features that distort the charged particle beam.

13. The method recited in claim 7 wherein: b) adjusting the formatted set of pattern records to accommodate desired pattern corrections includes adjusting the formatted set of pattern records to account for pattern blurring caused by electron density in an exposure pattern.

14. The method recited in claim 7 wherein: b) adjusting the formatted set of pattern records to accommodate desired pattern corrections includes modifying the formatted set of pattern records to accommodate a rotation of the pattern to be printed.

15. The method recited in claim 1 wherein:

a) condensing an initial design further comprises compressing the formatted set of pattern records using data compression techniques to form a compressed formatted set of pattern records; and c) extracting portions of the adjusted formatted pattern file includes decompressing the compressed formatted set of pattern records.

16. The method recited in claim 1 wherein:

extracting portions of the adjusted formatted set of pattern records comprises converting the extracted portions into data streams includes configuring the data streams to resolve data ambiguities at edge interfaces between adjacent channels of the data streams.

17. The method recited in claim 16 wherein extracting portions of the adjusted formatted set of pattern records includes storing the data streams to buffer electronics of the pattern generator.

18. The method recited in claim 1 wherein printing the pattern of profiles from each data stream onto a substrate includes using the profiles to grey scale the printed pattern.

19. The method recited in claim 18 wherein said grey scaling is accomplished by altering the time of exposure of selected portions of the substrate to control dosage using time integration.

20. The method recited in claim 1 wherein said printing of the pattern is facilitated by a maskless lithography system that includes processing circuitry separate from a dynamic pattern generator (DPG) wherein, the condensing of the initial design pattern is conducted using the processing circuitry;

the adjusting of the formatted pattern file includes adjusting to accommodate swath rotation;

at least some of the adjusting of the formatted set of pattern records is conducted using the processing circuitry;

the adjusting to accommodate swath rotation is conducted using processing circuitry;

the extracting portions of the formatted set of pattern records includes extracting the formatted pattern records to a memory stack of the DPG;

the sequentially reading the data streams is conducted using circuitry of the DPG; and sequentially printing the pattern of profiles to the substrate is conducted using the DPG.

21. A process for conducting maskless lithography to form a pattern on a substrate using a dynamic pattern generator, the process comprising:
- storing a set of profiles in memory of a dynamic pattern generator, the profiles associated with a formatted set of pattern records that specify a die pattern to be formed on a substrate;
- receiving the formatted set of pattern records in a buffer of the pattern generator, wherein the pattern records define the die pattern in terms of profiles and pointers that define positional relationships between the profiles;
- extracting portions of the formatted pattern file and converting the extracted portions into data streams comprising a plurality of channels with each channel having a pattern of profiles and pointers that define a pattern to be written onto a target substrate;
- sequentially loading the data streams as rows of pixelized instructions into a first in first out logic execution stack (FIFO stack) of the pattern generator;
- sequentially executing the rows of pixelized instructions as they advance through the FIFO stack, wherein the sequential execution of the instructions enables rows of pixel elements of the pattern generator to selectively impress a pattern onto a charged particle beam to achieve photolithographic pattern writing onto the target substrate.

22. The process recited in claim 21 further including the operation of conducting pattern verification for the rows of pixel elements.

23. The process recited in claim 21 wherein the profiles and the pointers are identified with small words of 10 bits or less.

24. The process recited in claim 21 wherein the pattern produced by executing the rows of pixelized instructions moves across the array elements of the pattern generator at the same rate as the pattern generator moves across the surface of the target substrate upon which the pattern is formed.

25. A formatted set of pattern records that defines a design pattern as a set of condensed information suitable for generating a pattern on a substrate using a charged particle lithography system, the formatted set of pattern records comprising:
- a set of designators and pointers which define a design pattern to be formed on a target substrate;
- each designator specifying a profile selected from a set of profiles, wherein the designator enables the extraction of a profile from storage, wherein each profile comprises one or more primitives enabling the formation of an image pattern that characterizes a portion of a desired pattern to be formed on the target substrate; and
- the pointers comprising spatial indicators associated with each profile, each spatial indicator specifies a position for an associated profile, the combination of profiles, designators and spatial pointers define an image pattern suitable for lithography pattern transfer onto a target using a charged particle lithography device.

26. The formatted set of pattern records recited in claim 25 wherein,
- the set of designators and pointers characterizes an initial design pattern to be formed on the target substrate; and
- the set of profiles comprises a set of uniquely generated profiles, wherein the set of uniquely generated profiles are uniquely associated with the initial design pattern.

27. The formatted set of pattern records recited in claim 25 wherein,
- the set of designators and pointers operate as computer readable instructions that operate to enable an initial design pattern to be formed on the target substrate; and
- the set of profiles comprises a set of uniquely generated profiles, wherein the set of uniquely generated profiles are uniquely associated with the initial design pattern.

28. The formatted set of pattern records recited in claim 25 wherein the set of profiles includes profiles configured to enable the formation of gray-scale image patterns.

29. The formatted set of pattern records recited in claim 25 wherein the set of profiles includes profiles configured to reduce the effects of image blurring caused by high charged particle density in a patterned charged particle beam.

30. The formatted set of pattern records recited in claim 25 wherein the set of profiles includes profiles comprised of instructions having a small word size.

31. The formatted set of pattern records recited in claim 30 wherein the set of profiles includes profiles comprised of instructions having word sizes of about 10 bits or less.

32. The formatted set of pattern records recited in claim 30 wherein the set of profiles includes profiles comprising end of line indicators.

33. The formatted set of pattern records recited in claim 30 wherein the set of profiles includes profiles comprising full line indicators.

34. A computer formatted set of pattern records embodied on a computer readable media including computer program code that defines a design pattern as a set of condensed information suitable for generating a pattern on a substrate using a charged particle lithography system, the computer formatted set of pattern records comprising:
- a set of designators and pointers embodied in a computer readable media that defines a design pattern to be written to a target substrate by a charged particle lithography device;
- designators embodied in a computer readable media such that each designator specifies a profile selected from a set of profiles, wherein the designator enables the extraction of a profile from storage, wherein each profile comprises one or more primitives enabling the formation of an image pattern that characterizes a portion of a desired pattern to be formed on the target substrate; and
- spatial pointers embodied in a computer readable media, the pointers comprising spatial indicators associated with each profile, each spatial indicator specifying a position for an associated profile so that the combination of profiles, designators and spatial pointers define an image pattern suitable for lithography pattern transfer onto a target using a charged particle lithography device.

35. A computer program product embodied on a computer readable media including computer program code for writing pattern data patterns onto a substrate with charged particle beam lithography using a selectively patterned charged particle beam, the computer program product including:
a) computer program code instructions for condensing an initial design pattern down to a set of profiles and associated spatial indicators that specify locations for the profiles to comprise a formatted set of pattern records that defines a desired pattern of features to be written to a target substrate by a patterned charged particle beam;
b) computer program code instructions for adjusting the formatted set of pattern records to accommodate desired pattern corrections;
c) computer program code instructions for extracting portions of the formatted set of pattern records to form a plurality of data streams in a plurality of channels with each channel comprising a pattern of profiles and spatial indicators that that specify locations for an associated profile, thereby enabling pattern to be written to be defined by data streams of simplified instructions;

d) computer program code instructions for sequentially reading the data streams to reconstruct the pattern to be written as a printable pattern of profiles and spatial indicators specifying the locations of the profiles; and e) computer program code instructions for sequentially impressing the pattern of profiles and spatial indicators of each data strip onto a charged particle beam which is directed onto an appropriate location of the target substrate to write the printable pattern thereon.

* * * * *